United States Patent
Esaki et al.

(10) Patent No.: US 9,659,357 B2
(45) Date of Patent: May 23, 2017

(54) DEVICE FOR CORRECTING IMAGE PROCESSING DATA, AND METHOD FOR CORRECTING IMAGE PROCESSING DATA

(71) Applicant: FUJI MACHINE MFG. CO., LTD., Chiryu (JP)

(72) Inventors: Hirotake Esaki, Ichinomiya (JP); Mitsuru Sanji, Toyota (JP)

(73) Assignee: FUJI MACHINE MFG. CO., LTD., Chiryu (JP)

(*) Notice: Subject to any disclaimer, the term of this patent is extended or adjusted under 35 U.S.C. 154(b) by 132 days.

(21) Appl. No.: 14/431,095

(22) PCT Filed: Sep. 28, 2012

(86) PCT No.: PCT/JP2012/075241
§ 371 (c)(1),
(2) Date: Mar. 25, 2015

(87) PCT Pub. No.: WO2014/049873
PCT Pub. Date: Apr. 3, 2014

(65) Prior Publication Data
US 2015/0235356 A1 Aug. 20, 2015

(51) Int. Cl.
*G06K 9/20* (2006.01)
*G06K 9/36* (2006.01)
*G06T 7/00* (2017.01)
*H01Q 1/22* (2006.01)
*H04N 7/18* (2006.01)

(52) U.S. Cl.
CPC .......... *G06T 7/0004* (2013.01); *H01Q 1/2258* (2013.01); *H04N 7/183* (2013.01)

(58) Field of Classification Search
CPC .......... H05K 13/0408; Y10T 29/53178; Y10T 29/49131; Y10T 29/53191; G06T 7/0002
See application file for complete search history.

(56) References Cited

FOREIGN PATENT DOCUMENTS

| JP | 2009 206377 | 9/2009 |
|---|---|---|
| JP | 2009 239126 | 10/2009 |
| JP | 2012 089634 | 5/2012 |
| WO | 2009 150721 | 12/2009 |

OTHER PUBLICATIONS

Machine translation of JP 2012-089634, published on May 10, 2012, to Amano Masafumi et al., 12 pages total.*
Machine translation of JP 2009-239126, published on Oct. 15, 2009, to Wada Toshiaki et al., 8 pages total.*
Machine translation of JP 2009-206377, published on Sep. 10, 2009, to Wada Toshiaki et al., 17 pages total.*
International Search Report Issued Dec. 25, 2012 in PCT/JP12/075241 filed Sep. 28, 2012.

* cited by examiner

*Primary Examiner* — Brian P Werner
(74) *Attorney, Agent, or Firm* — Oblon, McClelland, Maier & Neustadt, L.L.P.

(57) ABSTRACT

A mounting control device including an error detection device which detects an error based on image processing data and a component image taken of the component; and a data creation device which creates image processing data based on a component image, is provided. Processing of creating image processing data is performed automatically at a component mounting machine. Accordingly, because an operator does not need to perform work of creating image processing data, the work load on the operator may be reduced, and it is possible to improve work efficiency and productivity.

4 Claims, 4 Drawing Sheets

DEVICE FOR CORRECTING IMAGE PROCESSING DATA, AND METHOD FOR CORRECTING IMAGE PROCESSING DATA

TECHNICAL FIELD

The present disclosure relates to a device and method which corrects image processing data of a component that a component mounting machine configuring a component mounting line mounts at a component mounting position on a board.

BACKGROUND ART

At a component mounting machine, errors for component outer shapes, image processing data, and so on are judged by taking an image of a component being held on a suction nozzle with a camera and comparing that component image with previously memorized component image processing data. For example, there are cases in which the component image is indistinct depending on the component pickup orientation, and in these cases a judgment is made that an outer shape error of the component has occurred. Also, when newly starting board production, there are cases in which a component image does not match image processing data because the component is new as well. There are cases in which a component image does not match image processing data because items such as the shape or size of the component change slightly when the lot or manufacturer of a component is changed such as during board production. In these cases, a judgment whether there is a problem in the image processing data of the component is required. Then, if there is a problem in the image processing data, it is necessary to correct this data.

For example, according to the invention disclosed in patent literature 1, when an error occurs in image processing data at a component mounting machine configuring a component mounting line, a line control device controlling the component mounting line receives error information of image processing data from the component mounting machine and displays the error information. An operator corrects the image processing data by referring to a display of the error information of this image processing data, transmits the corrected image processing data to the component mounting machine, and restarts component mounting. In this way, because an operator can perform correction of image processing data and restarting of component mounting at the line control device side, work efficiency can be improved.

CITATION LIST

Patent Literature

Patent Literature 1: JP-A-2012-89634

SUMMARY

Technical Problem

According to the invention disclosed in patent literature 1, an operator needs to correct image processing data by referring to a display of the error information of image processing data at a line control device, but, because it is very time consuming work, work efficiency is bad and there is a risk of productivity being lowered. Also, according to the invention disclosed in patent literature 1, the configuration is such that an operator can check a component pickup error and lack of a component at the line control device side, but, because after the check it is necessary to move from the line control device to the component mounting machine at which the error occurred and recover from the component pickup error or lack of a component, work efficiency is bad and there is a risk of productivity being lowered.

The present disclosure takes the above issue into account and is directed to a device and method that enable image processing data of a component to be created automatically at a component mounting machine.

Solution to Problem

The present disclosure is directed to a device that, at a component mounting machine configuring a component mounting line in which a component is placed at a component mounting position on a board, corrects previously memorized image processing data of the component, and comprises: an error detection means which detects an error based on the image processing data and a component image taken of the component; a data creation means which creates the image processing data based on the component image; an image display means which on a display device displays a created data image that is created based on created image processing data created by the data creation means; and a data usage permission entry means with which a usage permission command for the created image processing data is entered.

With this kind of configuration, processing for detecting an error in image processing data and creating image processing data is performed automatically at a component mounting machine. Due to this, because an operator does not need to perform work of creating image processing data, the work load on the operator can be reduced, and it is possible to improve work efficiency and productivity. Also, the operator judges usability by referring to a created data image displayed on a displayed device, and if usable, can place a command of usage permission for the created image processing data. By this, because the operator does not need to move from the component mounting machine to a line control device controlling the component mounting line, it is possible to improve work efficiency and productivity.

DESCRIPTION OF EMBODIMENT

The following describes a case in which an embodiment of the present disclosure of a device for correcting image processing data is applied to a component mounting machine configuring a component mounting line based on the figures.

Figure 1:
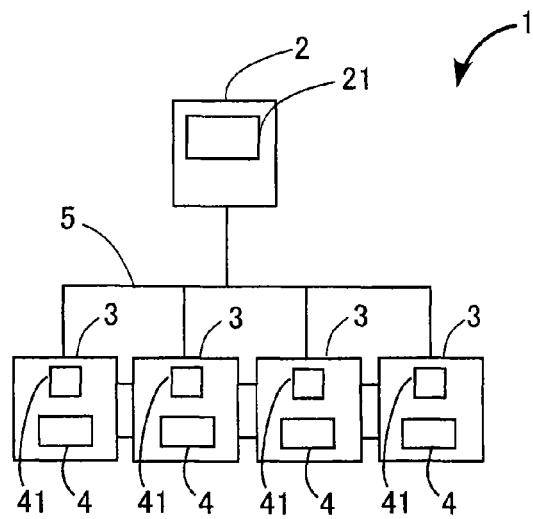
FIG. 1 is a configuration diagram showing a case in which an embodiment of the present disclosure of a device for correcting image processing data is applied to a component mounting machine configuring a component mounting line.

As shown in FIG. 1, component mounting line 1 is equipped with items such as one line control device 2, a plurality of component mounting machines 3 (four in this example), and communication network 5 which connects line control device 2 and mounting control device 4 of each of component mounting machine 3.

Line control device 2 is configured such that board manufacturing management and so on is possible by data being transmitted/received between mounting control device 4 of each component mounting machine 3 via communication network 5. On this line control device 2, display device 21 and a manual creation function for image processing data of a component mentioned below are provided.

Figure 2:
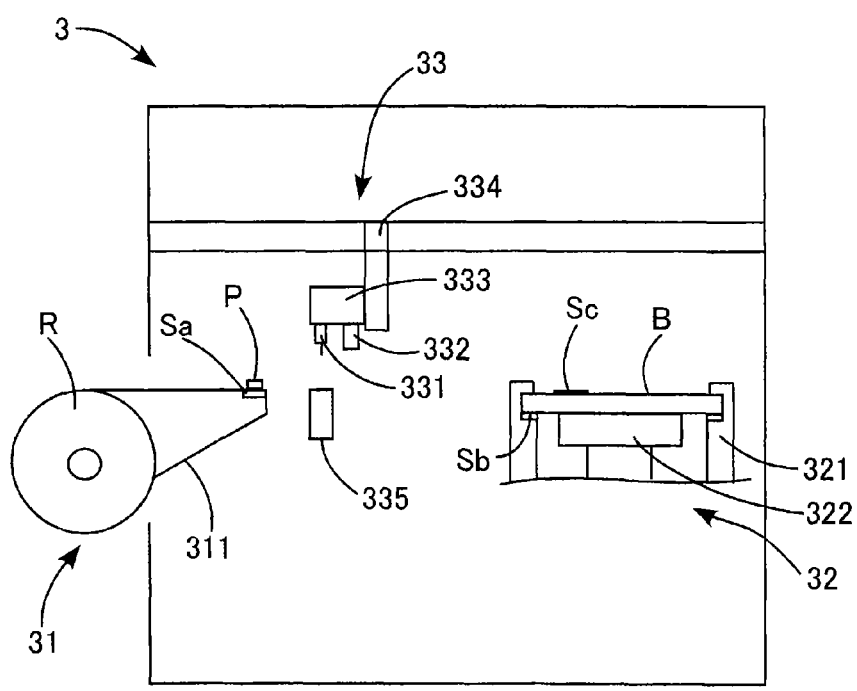
FIG. 2 is a diagram showing a schematic outline of the component mounting machine from FIG. 1.

As shown in FIG. 2, component mounting machine 3 is composed mostly of component supply device 31, board conveyance device 32, component mounting device 33, and so on. On component supply device 31, an item such as feeder 311 which supplies taped component P wound around reel R to component supply position Sa is attached. Provided on board conveyance device 32 are items such as conveyor 321 for conveying board B to board supply position Sb, and clamp device 322 for positioning and fixing board B conveyed to board supply position Sb. Provided on component mounting device 33 are items such as mounting head 333 equipped with suction nozzle 331 for picking up component P and board recognition camera 332 for taking an image of board B, XY robot 334 for moving mounting head 333 in a horizontal direction, and component recognition camera 335 for taking an image of component P being held on suction nozzle 331.

On mounting control device 4 of component mounting machine 3, display device 41, and an automatic creation function for image processing data of component P mentioned below are provided.

To describe general operation of component mounting at component mounting machine 3: mounting control device 4 moves suction nozzle 331 to component supply position Sa, and component P being supplied is picked up by suction nozzle 331. Then, an image of component P being held is taken with component recognition camera 335. Upon performing image processing of a component image taken of component P mentioned below, if an image processing error occurs such as if the outer shape size of the component for which an image is taken is different from the outer shape size of the component specified in the image processing data or if the number or position of leads of the component is different, creating image processing data and so on are performed based on the component image taken of component P. Then, component P being held is moved above board B which is positioned and fixed at board supply position Sb, and is mounted at component mounting position Sc. The above operation is repeated for the number of components to be mounted.

Figure 3A:
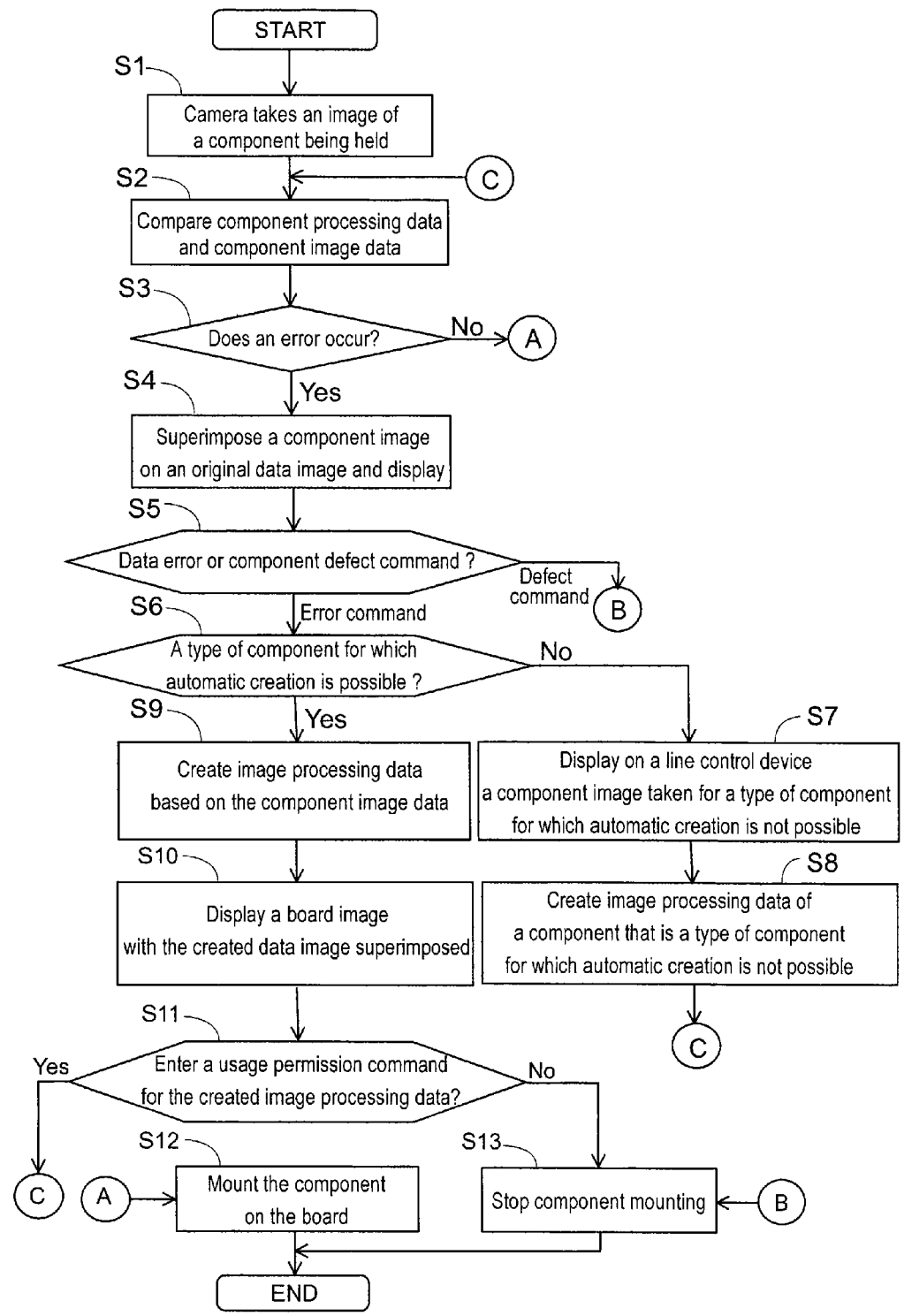
FIG. 3A is a first flow chart to illustrate operation of the device for correcting image processing data of this embodiment.

Next, the flow chart in FIG. 3A is referenced to describe correcting operation of image processing data at component mounting machine 3. Component mounting machine 3 is such that: an image of component P being held on suction nozzle 331 is taken with component recognition camera 335 (step S1); and previously memorized image processing data of component P is compared to component image data created based on the taken component image (step S2). Then, a judgment is made as to whether an error has occurred for the size, outer shape and so on of component P (step S3, which corresponds to the "error detection means").

Component mounting machine 3 is such that, if no error occurs for the outer shape and image processing data and so on of component P in step S3, processing continues to step S12 and component P is placed at component mounting position Sc on board B, then all processing ends. On the other hand, if an error occurs for the outer shape or image processing data and so on of component P in step S3, the taken component image is superimposed on the data image created based on the original image processing data of component P and displayed on display device 41 (step S4).

Figure 4:
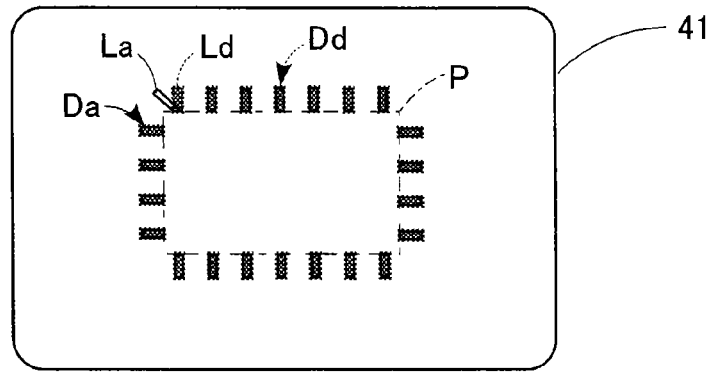
FIG. 4 is a diagram showing a display example for when a component itself is defective at a device for correcting image processing data of this embodiment.

Here, an operator judges whether the original image processing data of component P is an error or component P itself is defective. For example, as shown in FIG. 4, for a plurality of leads Ld (sections shown by dotted areas) in data image Dd created based on the original image processing data of component P (for example, DIP [Dual Inline Package]), if lead La in the upper left section of a plurality of leads La (sections shown by solid lines) of taken component image Da is bent by an amount exceeding the mounting tolerance for board B, a judgment is made that component P itself is defective.

Figure 5:
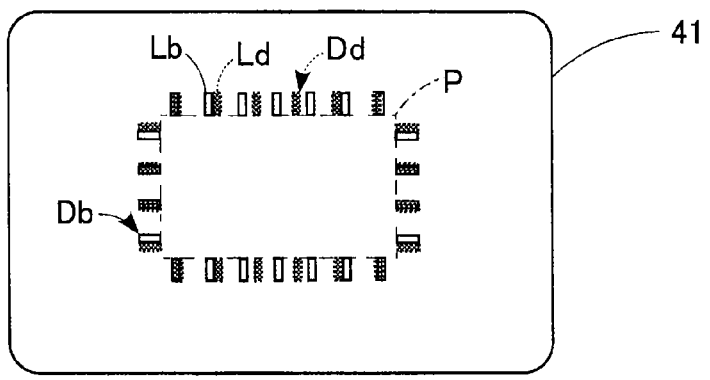
FIG. 5 is a diagram showing a display example for when there is an error for image processing data of a component at a device for correcting image processing data of this embodiment.

Also, for example, as shown in FIG. 5, for a plurality of leads Ld (sections shown by dotted areas) in data image Dd created based on the original image processing data of component P (for example, DIP), if there is a difference in the number or position of a plurality of leads Lb (sections shown by solid lines) of taken component image Db, a judgment is made that the original image processing data is an error.

Component mounting machine 3 is such that: in step S5, a judgment is made as to whether an error command of image processing data or a component defect command is entered by an operator; and if a judgment is made that a component defect command has been entered by an operator, processing continues to step S13, component mounting is stopped and defective component P is discarded, then all processing ends. On the other hand, component mounting machine 3 is such that, if a judgment is made that an error command of image processing data has been entered by an operator, a judgment is made as to whether component P is a type of component for which automatic creation of image processing data is possible (step S6). A type of component for which automatic creation is not possible is, for example, a BGA (Ball Grid Array) for which the main body of the component is white; this is because in the case of this component a bump image with the resolution required for automatic creation cannot be obtained.

Component mounting machine 3 is such that: in step S6, if component P is a type of component for which automatic creation is not possible, in order to have an operator create image processing data of component P at line control device 2 controlling component mounting line 1, component image data taken of component P that is a type of component for which automatic creation is not possible is transmitted to line control device 2. Line control device 2 displays the transmitted component image on display device 21 (step S7, which corresponds to the "means for performing creation at a line control device" and the "means for displaying an image at a line control device").

An operator compares the component image being displayed at display device 21 with the data image, and creates image processing data of component P that is a type of component for which automatic creation is not possible. Line control device 2 sends the created image processing data to mounting control device 4 of component mounting machine 3 (step S8, which corresponds to the "means for performing creation at a line control device" and the "image processing data changing means".) Then, component mounting machine 3, returning to step S2, compares changed image processing data of component P with component image data created based on the taken component image. Because image processing data has only been newly created, meaning that image processing of component P being held has not been performed, component pickup position correction amount calculation and so on have not been performed, so component P cannot be mounted on board B with mounting position correction. Then, if image processing data has been created correctly, because there is no error in step S3, processing continues to step S12, and component P that is a type of component for which automatic creation is not possible is placed at component mounting position Sc on board B, then all processing ends. On the other hand, if image processing data has not been created correctly, data creation is performed again (step S4 to S8).

On the other hand, component mounting machine 3 is such that, in step S6, if component P is a type of component for which automatic creation of image processing data is possible, based on the component image data that is created based on the taken component image, image processing data of component P is created (step S9, which corresponds to the "data creation means" and the "means for performing creation at a mounter"). Then, a board image taken of component mounting position Sc on board B at which component P is mounted is superimposed on the created data image created based on the image processing data of component P which is created in step S9 (created image processing data) and displayed on display device 41 (step S10, which corresponds to the "image display means").

Figure 6:
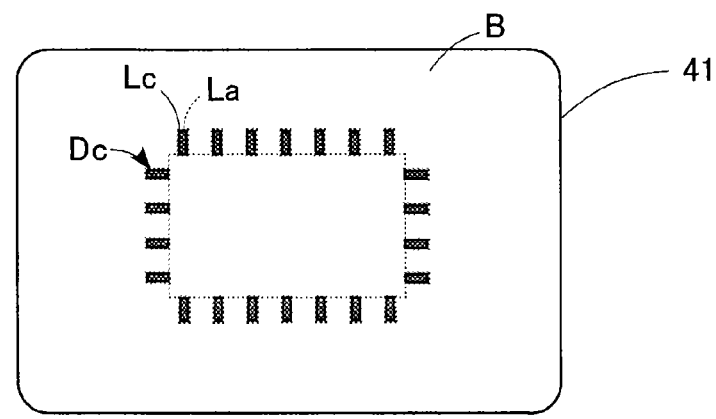
FIG. 6 is a diagram showing a display example for when a board image is superimposed on a corrected data image at a device for correcting image processing data of this embodiment.

Here, an operator judges by referring to display device 41 whether component P can be mounted at component mounting position Sc on board B. For example, as shown in FIG. 6, for a plurality of lands La on board B (sections shown by dotted areas), if a plurality of leads Lc in created data image Dc (sections shown by solid lines) are matching, a judgment is made that created data image Dc can be used; on the other hand, if lead Lc does not match land La by an amount exceeding the mounting tolerance for board B, a judgment is made that created data image Dc cannot be used.

Component mounting machine 3 is such that: a judgment is made as to whether a usage permission command or a usage prohibition command of created image processing data has been entered by an operator (step S11, which corresponds to the "usage permission entry means"); and if a judgment is made that a usage prohibition command of the created image processing data has been entered by the operator (if the answer is "No" in step S11), processing continues to step S13, and component mounting is stopped and component P is discarded, then all processing ends. On the other hand, component mounting machine 3, if a judgment is made that a usage permission command of the created image processing data has been entered by an operator (if the answer is "Yes" in step S11), returning to step S2, compares the created image processing data of component P with component image data created based on the taken component image. Because image processing data has only been newly created, meaning that image processing of component P being held has not been performed, component pickup position correction amount calculation and so on have not been performed, so component P cannot be mounted on board B with mounting position correction. Then, in this case, because the image processing data has been created correctly, and there is no error in step S3, processing continues to step S12, and component P is placed at component mounting position Sc on board B, then all processing ends (step S12).

Figure 3B:
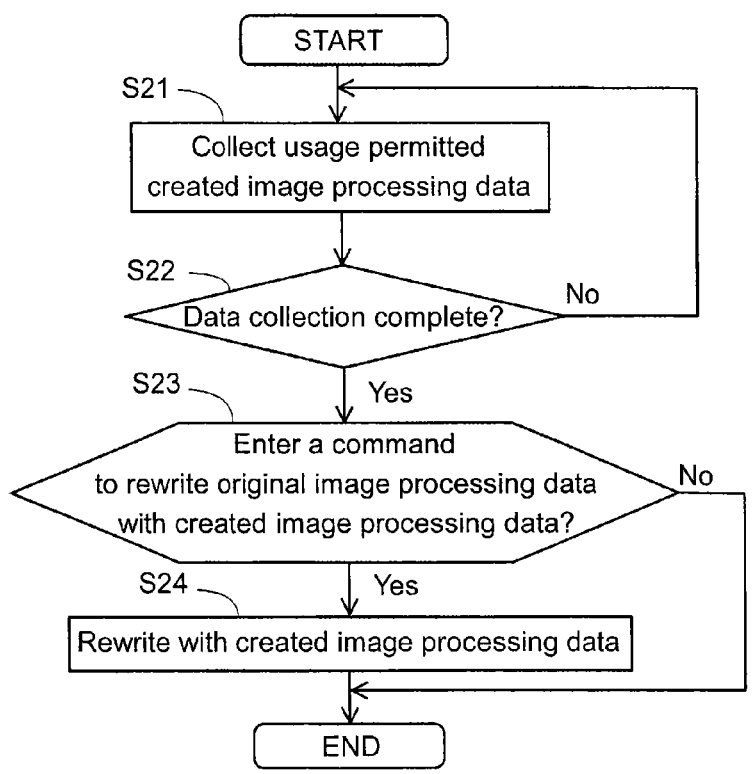
FIG. 3B is a second flow chart to illustrate operation of a device for correcting image processing data of this embodiment.

Next, the flow chart in FIG. 3B is referenced to describe rewriting operation at line control device 2 of the image processing data created at mounting control device 4. Line control device 2 collects created image processing data created based on a created data image which has been permitted to be used (step S21). Then, when image processing data collection is complete (step S22), a judgment is made as to whether a data rewriting command has been entered from mounting control device 4. In other words, a judgment is made as to whether a command has been entered by which, from among the plurality of types of image processing data of a component previously memorized in line control device 2, original image processing data which has become an error is replaced with the created image processing data (step S23, which corresponds to the "data rewriting command means"). Then, when a data rewriting command has been entered from mounting control device 4, the original image processing data is rewritten with the created image processing data (step S24), then all processing ends.

Because according to the above mentioned embodiment, mounting control device 4 comprises: an error detection means which detects an error by comparing image processing data and component image data created based on a component image taken of component P; and a data creation means which creates image processing data based on the component image data, if an error of the image processing data is detected by the error detection means, processing for detecting an error in image processing data and creating image processing data is performed automatically at component mounting machine 3. Due to this, because an operator does not need to perform work of creating image processing data, the work load on the operator can be reduced, and it is possible to improve work efficiency and productivity.

Also, because mounting control device 4 comprises an image display means which on display device 41 displays a created data image that is created based on created image processing data created by a data creation means; and a data usage permission entry means with which if the created data image displayed on display device 41 is usable, a usage permission command for the created image processing data is entered, an operator judges usability by referring to a created data image displayed on display device 41, and if usable, can place a command of usage permission for the corrected image processing data. By this, because the operator does not need to move from component mounting machine 3 to line control device 2 controlling component mounting line 1, it is possible to improve work efficiency and productivity.

According to the above mentioned embodiment, an image display means is such that a board image taken of component mounting position Sc on board B at which component P is mounted is superimposed on a created data image and displayed on display device 41. By this, an operator can easily judge whether component P is a target component for mounting to board B and mounting mistakes can be prevented.

According to the above mentioned embodiment, the data creation means is such that image processing data is created only if component P is a type of component for which automatic creation is possible. Due to this, if component P is a type of component for which automatic creation is not possible, it is changed to manual creation, which allows component mounting to continue and can prevent a drop in productivity.

According to the above mentioned embodiment, because mounting control device 4 comprises: a means for displaying an image at a line control device which, if component P is a type of component for which automatic creation is not possible, displays a component image taken of a type of component for which automatic creation is not possible on display device 21 of line control device 2; and a means for instructing creation at a line control device which instructs to create component image processing data for a previously memorized component that is a type of component for which automatic creation is not possible based on a component image displayed at display device 21 on line control device 2; an operator can start manual creation of image processing data immediately, which can prevent a drop in productivity.

According to the above mentioned embodiment, because mounting control device 4 comprises a data rewriting command means which places a rewriting command to, from among the plurality of types of image processing data of a component previously memorized in line control device 2 controlling component mounting line 1, rewrite original image processing data which has become an error with created image processing data created with a data creation means, original image processing data is not used mistakenly, which can prevent production management mistakes from occurring in production.

In such ways, the present disclosure is not limited to the configurations provided in the embodiment and there are various possible embodiments which do not extend beyond the range of the object of the present disclosure as given in the claims.

INDUSTRIAL APPLICABILITY

A device for correcting image processing data of the present disclosure can be applied not only to a component mounting machine but also to a general device which handles a component.

REFERENCE SIGNS LIST

1: Component mounting line
2: Line control device
3: Component mounting machine
4: Mounting control device
5: Communication network
21, 41: Display device
31: Component supply device
332: Board recognition camera
335: Component recognition camera
P: Component
B: Board

The invention claimed is:

1. A device for correcting image processing data which, at a component mounting machine configuring a component mounting line in which a component is placed at a component mounting position on a board, corrects previously memorized image processing data of the component, comprising:
   an error detection means which detects an error based on the image processing data and a component image taken of the component;
   a data creation means which creates the image processing data based on the component image;
   an image display means which on a display device displays a created data image that is created based on created image processing data created by the data creation means; and
   a data usage permission entry means with which a usage permission command for the created image processing data is entered,
   wherein the data creation means creates the image processing data based on a determination that the component is a type of component for which automatic creation is possible,
   wherein the image display means displays the created image processing data superimposed on a board image taken of the component mounting position of the board at which the component is mounted,
   wherein the usage permission command is based on a comparison between the created image processing data and the taken board image, and
   wherein the component mounting machine includes a mounting head including a suction nozzle and a first camera for taking the board image, and a second camera for taking the component image when the component is held on the suction nozzle.

2. The device for correcting image processing data of claim 1, further comprising:
   a means for performing creation at a mounter which, if the component is a type of component for which automatic creation is possible, makes the data creation means perform the creation; and
   a means for performing creation at a line control device which, if the component is a type of component for which automatic creation is not possible, makes the line control device controlling the component mounting line perform the creation,
   wherein the means for performing creation at a line control device comprises:
      a means for displaying an image at a line control device which displays the component image taken for a type of component for which automatic creation is not possible at a display device of the line control device; and
      an image processing data changing means which instructs to correct the previously memorized component image processing data for the component that is a type of component for which automatic creation is not possible based on the component image displayed at the display device on the line control device.

3. The device for correcting image processing data of claim 1, further comprising:
   a data replacing command means which places a rewriting command to rewrite, from among the plurality of types of image processing data of a component that are previously memorized in the line control device controlling the component mounting line, the image processing data which has become error with the created image processing data that was created with the data creation means.

4. A method for correcting image processing data which, at a component mounting machine configuring a component mounting line in which a component is placed at a component mounting position on the board while boards are conveyed, corrects previously memorized image processing data of the component, comprising:

an error detection process to detect an error by comparing the image processing data and component image data created based on a component image taken of the component;

a data creation process to create the image processing data based on the component image data if an error is detected in the image processing data in the error detection process;

an image display process to display on a display device a created data image that is created based on the image processing data created in the data creation process; and a data usage permission entry process in which a usage permission command is entered if the created data image displayed at the display device is usable, wherein the image processing data is created based on a determination that the component is a type of component for which automatic creation is possible, wherein the image display process includes displaying the created data image superimposed on a board image taken of the component mounting position of the board at which the component is mounted, wherein the usage permission command is based on a comparison between the created data image and the taken board image, and wherein the component mounting machine includes a mounting head including a suction nozzle and a first camera for taking the board image, and a second camera for taking the component image when the component is held on the suction nozzle.

* * * * *